United States Patent [19]
Hofstetter

[11] Patent Number: 6,144,925
[45] Date of Patent: Nov. 7, 2000

[54] DEVICE AND METHOD FOR DETERMINING THE SIGN OF THE PHASE ANGLE OF TWO ELECTRICAL SIGNALS

[75] Inventor: Christoph Hofstetter, Wagenstadt, Germany

[73] Assignee: Ch. BEHA GmbH Technische Neuntwicklungen, Glottertal, Germany

[21] Appl. No.: 08/993,522

[22] Filed: Dec. 18, 1997

[30] Foreign Application Priority Data

Dec. 20, 1996 [DE] Germany ............................. 196 53 323

[51] Int. Cl.[7] ................................................. G01R 25/00
[52] U.S. Cl. .................................. 702/72; 702/65; 324/86
[58] Field of Search .................................. 702/72, 60, 65; 324/86; 361/76, 85

[56] References Cited

U.S. PATENT DOCUMENTS

| | | | |
|---|---|---|---|
| 3,652,933 | 3/1972 | Rubner et al. | 324/82 |
| 4,901,005 | 2/1990 | Shin et al. | 324/86 |
| 5,103,162 | 4/1992 | Markus | 324/83 D |
| 5,212,407 | 5/1993 | Gaddis et al. | 307/87 |
| 5,378,979 | 1/1995 | Lombardi | 324/107 |
| 5,420,503 | 5/1995 | Beha | 324/108 |
| 5,521,491 | 5/1996 | Najam | 324/86 |
| 5,859,530 | 1/1999 | Beha | 324/86 |

FOREIGN PATENT DOCUMENTS 31 17 284 A1   11/1982   Germany.
40 02 603 A1   8/1991   Germany.

OTHER PUBLICATIONS

Patent Abstracts of Japan, P–800 Dec. 14, 1998 vol. 12/No. 477 Phase Rotation Detector:, JP 63–195 579 (A).

*Primary Examiner*—Patrick Assouad
*Attorney, Agent, or Firm*—Nath & Associates; Gary M. Nath; Harold L. Novick

[57] ABSTRACT

The present invention pertains to a device and method for determining the sign of a phase angle of a first and second, essentially identical, periodic electric signals on corresponding first and second electrical conductors L1, L2, in particular, to determine the phase sequence in a three-phase power system. The device according to the present invention has a sensing device for sensing of the first signal from the first conductor L1 and of the second signal from the second conductor L2; a trigger device 25 for receiving the sensed first signal and specifying a time reference point and/or a time reference window within the signal period of the first signal and outputting a corresponding trigger signal; and a determination device 31, 32, 33 for receiving the trigger signal and the sensed second signal and determining the sign of the phase angle under consideration of at least the value of the second signal at the time reference point and/or the waveform of the second signal within the time reference window.

18 Claims, 7 Drawing Sheets

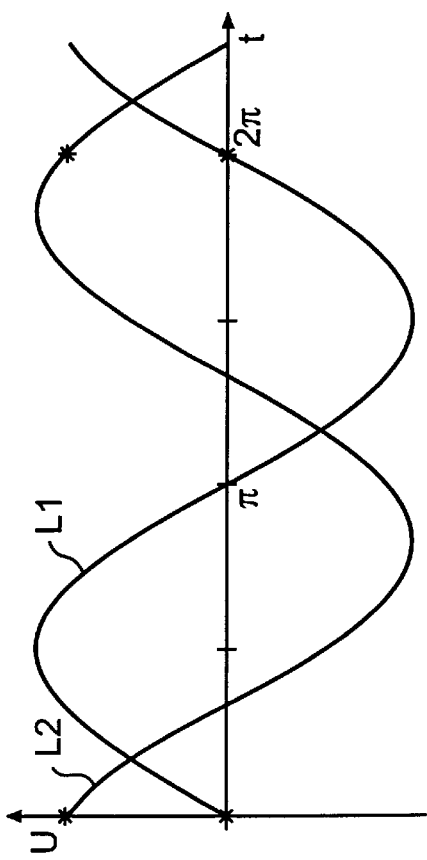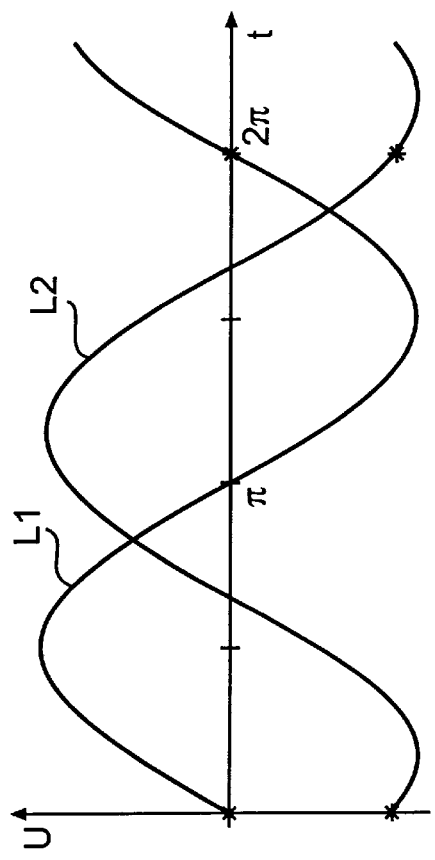

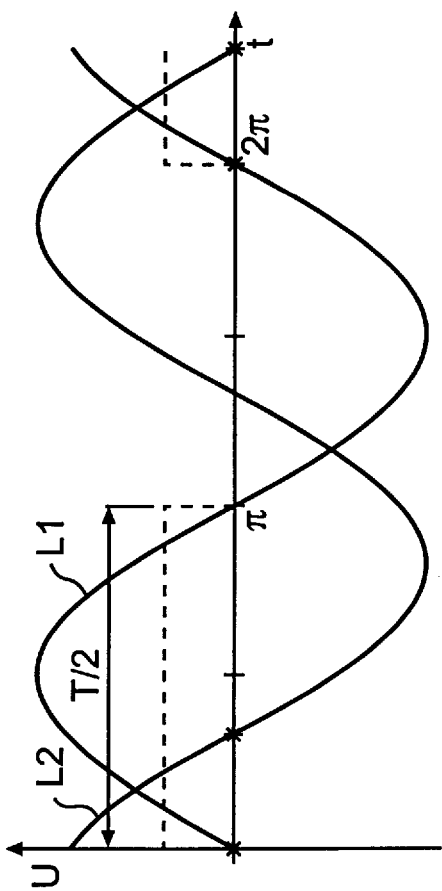
FIG. 5.1
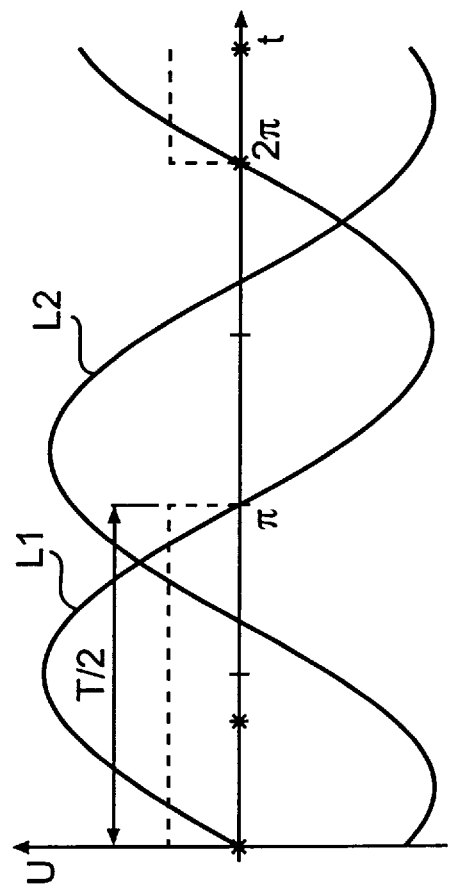
FIG. 5.2

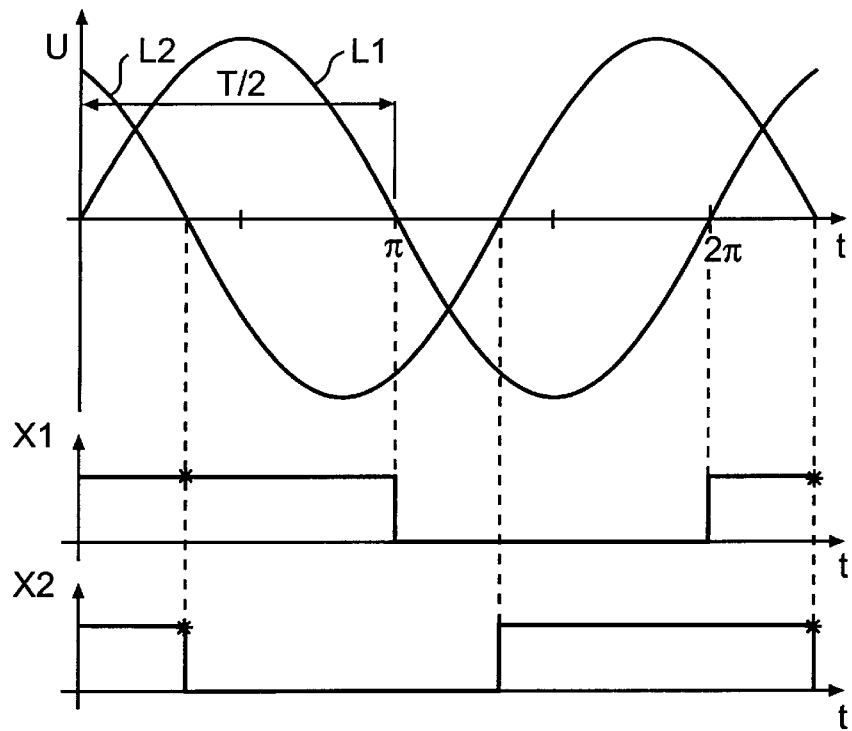
FIG. 7.1
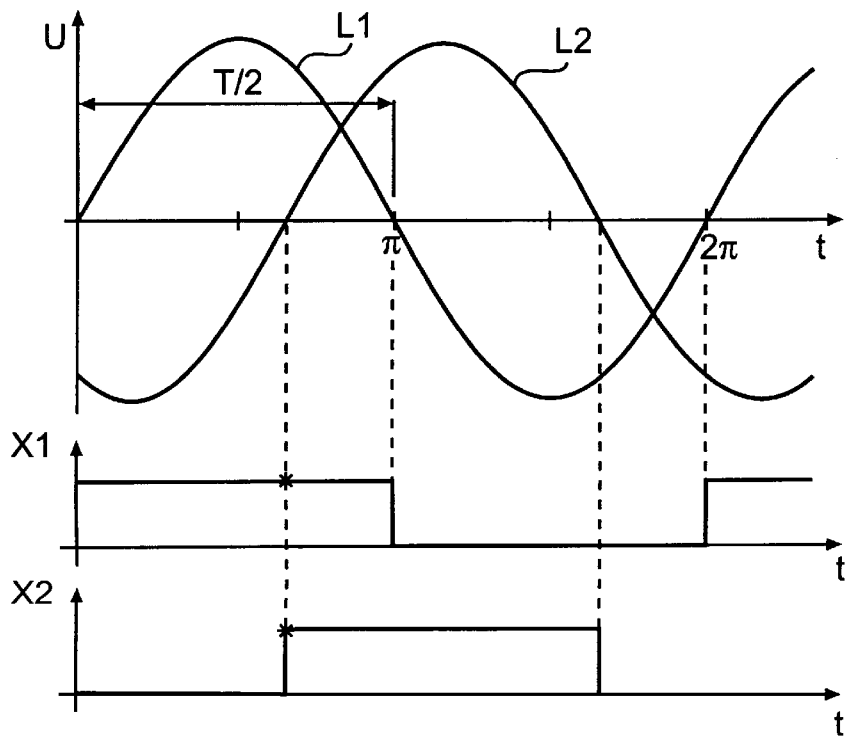
FIG. 7.2

DEVICE AND METHOD FOR DETERMINING THE SIGN OF THE PHASE ANGLE OF TWO ELECTRICAL SIGNALS

FIELD OF THE INVENTION

The present invention pertains to a device and a method for determining the sign of a phase angle of a first and second, essentially identical, periodic electric signals on corresponding first and second electrical conductors, in particular to determine the phase sequence in a three-phase power system.

BACKGROUND OF THE INVENTION

Without restricting its general versatility to any particular electrical signals, the present invention and the underlying problem will be explained in greater detail below based on the devices and methods for phase sequence determination of three-phase power systems.

This is described in the state of the art a whole series of different phase sequence determination devices and corresponding methods for three-phase power systems.

Devices for determining phase sequence are always employed when the three sinusoidal signals of a three-phase power system or three-phase network—each shifted in phase by 120°—cannot be unambiguously associated with the existing conductors. When connecting three-phase equipment, such as three-phase motors, the phase sequence must be correct for all connections so that the equipment will function properly.

A measuring device is known from DE 40 02 603 A1, with which the sum of voltages of two phases is measured across a ground terminal with respect to ground.

Also, a measuring device without ground terminal is known from DE 40 02 603 A1 which has a diverter lug located in a handle which can be connected to a reference potential. The diverter lug runs parallel to the handle of one of two test points and during the measurement, together with the user's hand surrounding the handle, it acts as a capacitor to ground.

Ground terminals and diverter lugs are problematic, since they require a tight contact by the user. In addition, the length or the spatial arrangement of a connecting line from the ground terminals or diverter lugs can cause difficulties, since the capacitive currents used by them to determine the direction of rotation can be affected in such a manner that they are no longer large enough to implement the measurement.

From DE 31 17 284 A1 a switching device is known for monitoring of a symmetrical three-phase AC signal. Each conductor of the three phase system has one zero-crossing detector which generates a corresponding pulse for each respective zero crossing. These pulses are supplied to a phase sequence monitoring circuit, which determines whether a zero crossing pulse of the third phase occurs between two zero crossing pulses which are assigned to two sequential, connected phases. If this is the case, then a false assignment is present. A determination of the phase sequence is not possible with this known circuit arrangement, since it determines solely by means of a logic device whether a zero crossing of the third phase is present.

SUMMARY OF THE INVENTION

Therefore, the purpose of the present invention is to offer a device and a method to determine the sign of the phase angle of two electrical signals of the type described above, which will allow a dependable and simple determination of the sign of the phase angle and of the respective phase sequence.

According to the present invention, the problem is solved by a device specified herein that is for determining the sign of a phase angle of a first and second, essentially identical, periodic electric signals on corresponding first and second electrical conductor, in particular to determine the phase sequence in a three-phase power system, with a sensing device for sensing the first signal from the first conductor and the second signal from the second conductor; a trigger device for receiving the sensed first signal and specifying a time reference point and/or a time reference window within the signal period of the first signal and outputting a corresponding trigger signal; and a determination device for receiving the trigger signal and the sensed second signal and determining the sign of the phase angle under consideration at least of the value of the second signal at the time reference point and/or the waveform of the second signal within the time reference window.

One particular advantage of the device according to the present invention is its dependable operation, which is not dependent on a particular ground terminal or on a diverter lug. The measured result can be easily and unambiguously displayed. The structure is simple and easy to implement and can be limited essentially to two test peaks, one microelectronic circuit, e.g., a microprocessor, and two lamps, e.g., LEDs.

In particular, with the device according to the present invention, the phase sequence in a three-phase power system can be determined for any two of the three available phase conductors, since the phase position of the third phase conductor is obtained automatically therefrom.

Preferred refinements are the subject of the subordinate claims.

According to one preferred refinement, the trigger device is structured in such a manner that it specifies a predetermined, e.g., the rising, zero crossing of the first signal as the time reference point.

According to another preferred refinement, the determination device is designed in such a manner that it determines the sign of the phase angle from the sign of the second signal at the time reference point.

According to an additional preferred refinement, the trigger device has a first comparator device to receive the first signal and to compare it with a predetermined reference potential and a differentiating device for taking the derivative of the output signal of the first comparator device. In addition, the determination device has a second comparator device to receive the second signal and to compare it with the predetermined reference potential and a memory device to receive the output signal of the second comparator device and of the output signal from the differentiating device. In this case, the memory device is designed in such a manner that for each output signal from the differentiating device with a predetermined sign, said memory device stores the sign of the output signal of the second comparator device.

According to another preferred refinement, the memory device has a flip-flop unit.

According to yet another preferred refinement, the trigger device is designed so that it specifies a half signal period of the first signal following a predetermined, e.g., the rising, zero crossing of the first signal as the time reference window.

According to an additional refinement of the invention, the determination device is designed in such a manner that it digitizes and stores at least the second signal and determines the sign of the phase angle by determining whether the digitized second signal has a predetermined, e.g., the falling, zero crossing within the time reference window.

According to another preferred refinement of the invention, the trigger device has a first-comparator device to receive the first signal and to compare it with a predetermined reference potential, and a differentiating device to form the derivative of the output signal of the first comparator device and also a time-window generating device to receive the output signal of the differentiating device and to generate a time window signal for each output pulse of the differentiating device with a predetermined sign. The determination device is a second comparator device to receive the second signal and to compare it with the predetermined reference potential and a memory device to receive the time window signal of the time-window-generating device and the output signal of the second comparator device. In this case, the memory device is designed so that it will store the arrival of the predetermined zero crossing of the second signal within the time reference window.

According to another preferred refinement, the memory device has a Schmitt trigger device.

According to yet another preferred refinement, the trigger device is designed in such a way that it defines a predetermined part, e.g., the positive, half-wave of the first signal, as a time reference window.

According to another preferred refinement, the determination device is designed in such a way that it digitizes at least the second signal, stores it and determines the sign of the phase angle by determining whether the digitized second signal has a predetermined part, e.g., a falling flank, within a temporal reference window.

According to another preferred refinement, the trigger device has a first comparator device to receive the first signal and to compare it with a predetermined reference potential. The determination device has a second comparator device to receive the second signal and to compare it with the predetermined reference potential and a logic processing device to receive the output signal of the first comparator device and of the second comparator device. In this case, the logic processing device is designed in such a manner that it determines the sign of the phase angle by determining whether the second signal has a predetermined flank when the output signal of the first comparator device takes on a predetermined state.

According to an additional refinement, a display device which is connected to the determination device is provided to display the determined sign of the phase angle. In one particularly preferred case, the display device is a lamp, e.g., a LED.

According to an additional refinement, the sensing device is designed in such a manner that exclusively resistive components are used for sensing the first and the second signal. Thus, reactances cannot exert any influence on the measurement.

According to an additional, preferred refinement, the first and second electrical conductors are connected to a common node which is at a defined potential. Preferably, the coupling of the common node to the reference potential can take place in nearly any manner.

According to another preferred refinement, the common node can be connected to ground potential during the determination of the sign of the phase angle.

According to an additional, preferred refinement, a galvanic connection device is provided to connect the common node to the ground potential.

According to an additional, preferred refinement, a resistive connecting device running via a contact electrode and the human body is used for connecting of the common node.

According to an additional, preferred refinement, a capacitive connecting device running via the human body is provided for connection of the common node to ground potential.

In addition, a above problem is solved by a method in accordance with the present invention.

BRIEF DESCRIPTION OF THE DRAWINGS

The present invention will be explained in greater detail below with reference to the accompanying drawings.

Shown are

FIG. 3: Diagrams of the phase-shifted signals of two electric conductors to explain the first embodiment according to FIG. 2, i.e., FIG. 3.1 shows the case in which the signal on the first conductor precedes that on the second conductor, and FIG. 3.2 shows the case in which the signal on the second conductor precedes that on the first conductor;

FIG. 5: Diagrams of the out-of-phase signals of two electrical conductors to explain the second embodiment according to FIG. 4, namely FIG. 5.1 shows the case in which the signal of the first conductor leads that of the second conductor, and FIG. 5.2 shows the case in which the signal of the second conductor leads that of the first conductor;

FIG. 7: Diagrams of the out-of-phase signals of two electrical conductors to explain the second embodiment according to FIG. 6, namely FIG. 7.1 shows the case in which the signal of the first conductor leads that of the second conductor, and FIG. 7.2 shows the case in which the signal of the second conductor leads that of the first conductor.

DETAILED DESCRIPTION OF THE PRESENTLY PREFERRED EMBODIMENTS

The same reference numbers in the figures pertain to the same, or to functionally equivalent, components.

Figure 1:
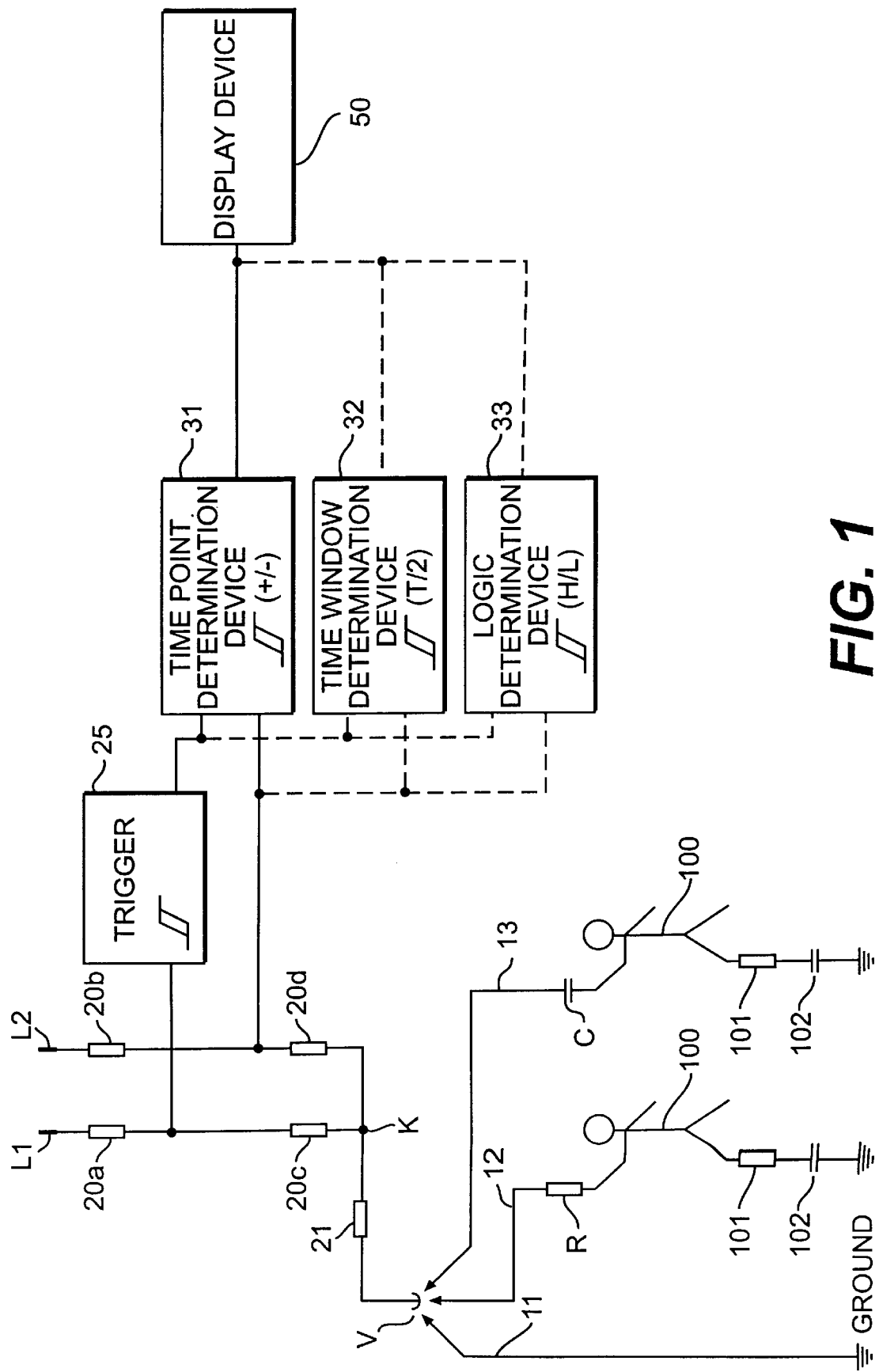
FIG. 1: A schematic overview of three preferred embodiments of the device according to the present invention.

FIG. 1 shows a schematic overview of three preferred embodiments of the device according to the present invention.

In FIG. 1, reference numbers L1 and L2 denote a first and a second electrical conductor which conduct a first and second, essentially identical, sinusoidal electric signal, wherein the two signals have a particular phase angle. This phase angle lies in the range between −180° and +180° (−π and +π). The device according to the present invention is used to determine the sign of the phase angle, i.e., which of the two signals leads or lags the other.

The two electrical conductors have internal or external inserted resistors 20a, 20b, 20c and 20d and are connected together at a common node K, which rests at a predetermined potential and is connected to a connection point V via an additional resistor 21 of this type.

Proceeding from the connection point V, a connection of the common node K to the ground potential PEN can take place via three different types of connecting devices 11, 12 and 13.

Reference number 11 denotes a connecting device for connection of the common node K to the ground potential PEN via a galvanic connecting line.

Reference number 12 denotes a connecting device for connection of the common node K to the ground potential PEN via a resistive connection line running via a shock-proof electrode and the human body 100. In this case, reference symbols R and 101 denote a particular resistor and 102 denotes a capacitor.

Reference number 13 denotes a connecting device for connection of the common node K to the ground potential PEN via a capacitive connection line running via the human body 100. In this case, reference symbols C and 102 denote a particular capacitor and 101 denotes a resistor.

Reference number 25 denotes a trigger device to receive the sensed first signal of the first conductor L1. The trigger device specifies a time reference point and/or a time reference window within the signal periods of the first signal and outputs a corresponding trigger signal.

Three cases in accordance with three preferred embodiments can be distinguished, whereby the first embodiment shown in FIG. 1 is indicated by solid lines, and the second and third embodiments are indicated by dashed lines.

In the first embodiment, the trigger device 25 creates a time point pulse for any randomly defined, but constant phase position of the first signal, e.g., specific zero crossing or maximum or minimum or specific slope.

This time point pulse is sent to a determination device 31 which determines the polarity of the second signal at the time point of the time point pulse and from this determines the sign of the phase angle, that is, carries out a time point analysis.

In the second embodiment, the trigger device 25 creates a time window pulse for the duration of a half signal period of the first signal, for any randomly defined, but constant phase position of the first signal, e.g., specific zero crossing or maximum or minimum or specific slope.

This time point pulse is sent to a determination device 32 which determines whether the second signal has a predetermined zero crossing for the duration of the time window pulse, and from this determines the sign of the phase angle, that is, carries out a time window analysis.

In the third embodiment, the trigger device 25 likewise creates a time window pulse for the duration of a half signal period of the first signal, wherein this pulse coincides with a particular sign of the first signal.

This time point pulse is directed to a logic determination device 33, to which likewise the second signal is supplied in digitized form. This determination device 33 determines whether the second signal has a predetermined flank for the duration of the time window pulse, and from this determines the sign of the phase angle, that is, carries out a logic analysis.

After a determination of the sign of the phase angle, in all three embodiments it is displayed on a display 50, e.g., on a screen or an LCD display.

These three embodiments will be explained in detail below.

Figure 2:
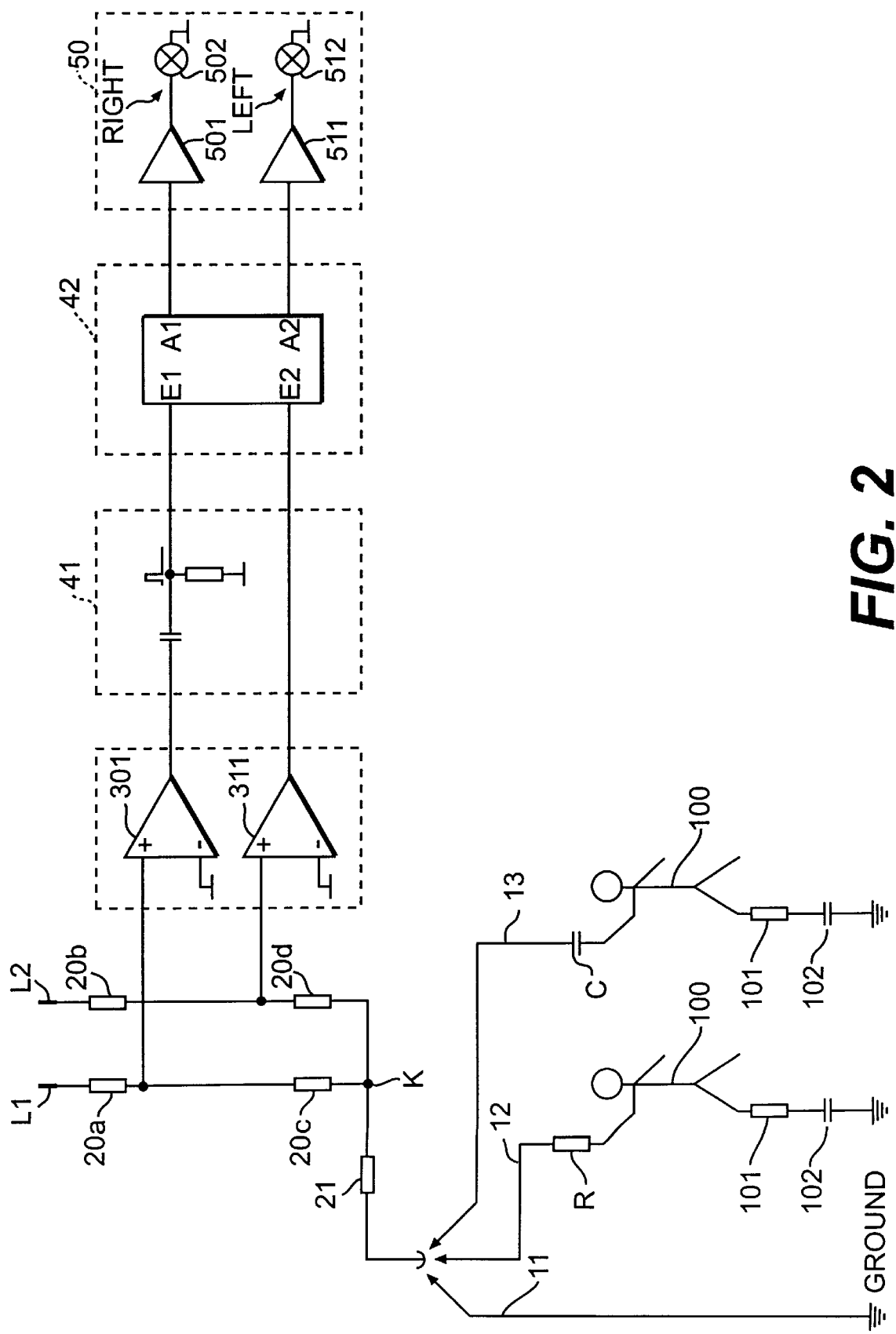
FIG. 2: A schematic representation of the first preferred embodiment of the device according to the present invention.

FIG. 2 shows a schematic representation of the first preferred embodiment of the device according to the present invention.

In the first embodiment, the trigger device has a first comparator 301 to receive the first signal and to compare it with a predetermined reference potential, preferably ground potential, and a differentiator 41 for taking the derivative of the output signal of the first comparator 301.

The determination device in the first embodiment has a second comparator 311 to receive the second signal and to compare it with the predetermined reference potential, and a memory device 42 to receive the output signal of the differentiator 41 at input E1 and of the output signal of the second comparator 311 at input E2.

The memory device 42 is designed in such a manner that it stores the sign of the output signal of the second comparator 311 for each output pulse of the differentiator 41 with a positive sign. Of course, the output pulse of the differentiator 41 with negative sign could also be used for this purpose. It is expedient to use a flip-flop device for the memory device 42 in this case.

The memory device 42 has two outputs A1 and A2, which are connected to the display 50. The first output A1 activates a "right" display 501, 502 to display a right shift of the second signal with respect to the first signal, i.e., a negative phase angle. The second output A2 activates a "left" display 511, 512 to display a left shift of the second signal with respect to the first signal, i.e., a positive phase angle.

In the illustrated case the display 50 consists of a driver 501, 511 and a lamp 502, 512 driven by it.

FIG. 3 shows diagrams of the out-of-phase signals of the two electrical conductors L1, L2 to explain the first embodiment according to FIG. 2. In this case, time is plotted on the abscissa and the respective signal amplitude on the ordinate.

FIG. 3.1 shows the case in which the first signal on the first conductor L1 leads the second signal on the second conductor L2.

As indicated in FIG. 3.1 by prominent points in the signal waveform of the first signal, the differentiator 41 outputs a positive pulse for each rising zero crossing of the first signal, since the signal of the comparator 301 always changes with rising flank.

Based on the positive sign of the phase angle, at the time of the positive pulse, the second signal is always positive, which is determined by the memory device 42 from the output signal of the second comparator 311, stored, and then sent via the output A2 to the display 50, so that then the left lamp 512 is lit.

FIG. 3.2 shows the case in which the second signal on the second conductor L2 leads the first signal on the first conductor L1.

Based on the negative sign of the phase angle, at the time of the positive pulse—which is indicated by prominent points in the signal waveform of the first signal—the second signal is always negative, which is determined by the memory device 42 from the output signal of the second comparator 311, stored, and then sent via the output A1 to the display 50, so that then the right lamp 502 is lit.

Figure 4:
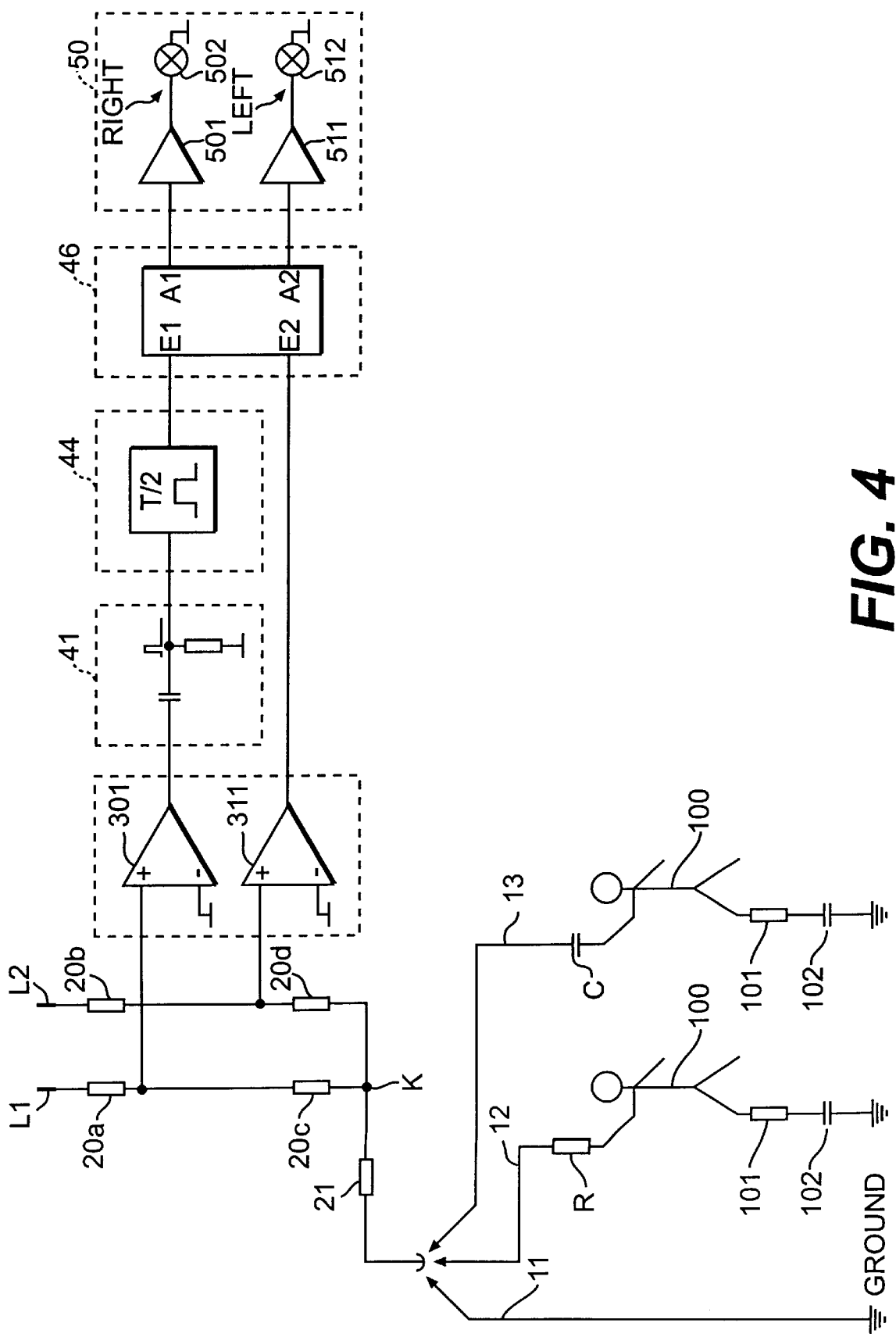
FIG. 4: A schematic representation of the second preferred embodiment of the device according to the present invention.

FIG. 4 shows a schematic representation of the second preferred embodiment of the device according to the present invention.

In the second embodiment, the trigger device likewise has a first comparator 301 to receive the first signal and to compare it with a predetermined reference potential, preferably ground potential, and a differentiator 41 to take the derivative of the output signal of the first comparator.

In addition to the first embodiment shown in FIG. 2, the trigger device includes a time-window generation device 44, preferably a monostable, to receive the output signal of the differentiator 41 and to generate a time window signal for each output pulse of the differentiator 41 with a positive sign. Of course, the time window can also be created in response to an output pulse of the differentiator 41 with a negative sign.

The determination device in the second embodiment has a second comparator 311 to receive the second signal and to compare it with the predetermined reference potential, and a memory device 46 to receive the output signal of the time-window generation device 44 at a first input E1 and of the output signal of the second comparator at a second input E2.

The memory device 46 is designed in such a manner that it stores the arrival of a falling zero crossing of the second signal within the time reference window. It is expedient for the memory device 46 to have a Schmitt trigger device in this case. Of course, it could also save the arrival of an ascending zero crossing.

The other constituents of the second embodiment correspond to those of the first embodiment explained above.

FIG. 5 shows diagrams of the out-of-phase signals of the two electric conductors L1, L2 to explain the second embodiment according to FIG. 4. In this case, time is plotted on the abscissa and the particular signal amplitude is plotted on the ordinate.

FIG. 5.1 shows the case in which the first signal on the first conductor L1 leads the second signal on the second conductor L2.

As indicated in FIG. 5.1 by prominent points on the signal waveform, the differentiator 41 outputs a positive pulse each time for an ascending zero crossing of the first signal, because the signal of the comparator 301 always changes with a rising flank.

In response thereto, as indicated in FIG. 5.1 by a dashed-line time window of one-half signal period T/2 of the first signal adjoining the prominent points, the time-window generation device 44 creates a time window signal of length T/2 and applies this to the input E1 of the memory device 46.

Based on the positive sign of the phase angle, during the time window signal with the length T/2, a falling zero crossing of the second signal always occurs, which is determined by the memory device 46 from the output signal of the comparator 311, stored, and then sent via the output A2 to the display 50, whereupon the left lamp 512 is lit.

FIG. 5.2 shows the case in which the second signal on the second conductor L2 leads the first signal on the first conductor L1.

Based on the negative sign of the phase angle, during the time window signal with length T/2, no falling zero crossing of the second signal takes place, which is determined by the memory device 46 from the output signal of the comparator 311, stored, and sent via the output A1 to the display 50, whereupon consequently the right lamp 502 is lit.

Figure 6:
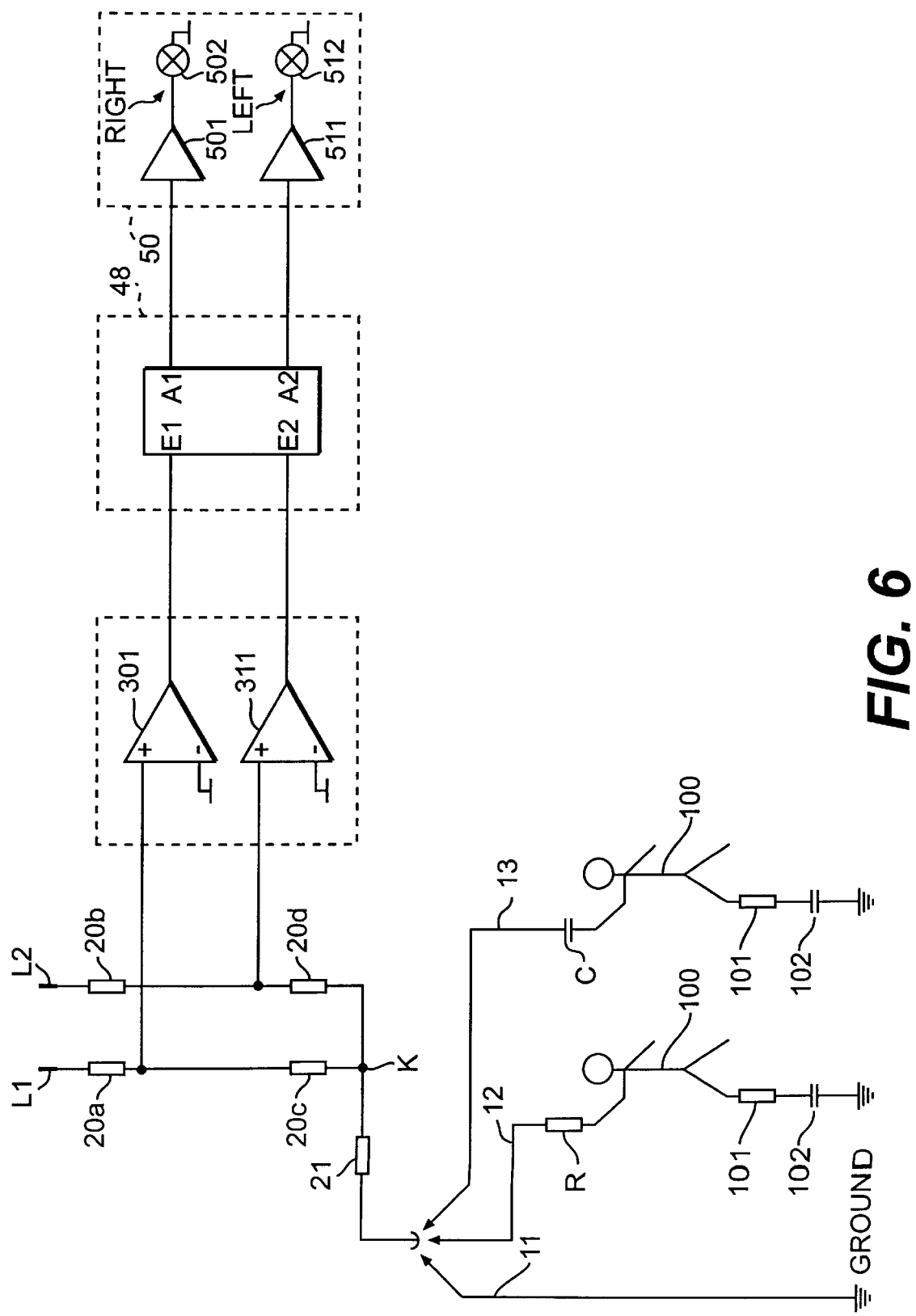
FIG. 6: A schematic representation of the third preferred embodiment of the device according to the present invention.

FIG. 6 shows a schematic representation of the third, preferred embodiment of the device according to the present invention.

The trigger device in the third embodiment likewise has a first comparator 301 to receive the first signal and to compare it with a predetermined reference potential, preferably ground potential.

The determination device in the third embodiment has a second comparator 311 to receive the second signal and to compare it with the predetermined reference potential and a logic processing device 48 to receive the output signal of the first comparator 301 to a first input E1 and of the second comparator 311 to a second input E2.

The logic processing device 48 is designed in such a manner that it determines the sign of the phase angle by determining whether the second signal has a falling flank, when the output signal of the first comparator 301 goes high. Of course, the presence of a rising flank can also be determined, and the low output signal of the first comparator 301 can also be used as trigger signal.

The other constituents of the third embodiment correspond to those of the first and second embodiments explained above.

FIG. 7 shows diagrams of the out-of-phase signals of the two electric conductors L1, L2 to explain the second embodiment according to FIG. 6. In this case, time is plotted on the abscissa and the particular signal amplitude on the ordinate.

FIG. 7.1 shows the case in which the first signal on the first conductor L1 leads the second signal on the second conductor L2.

In FIG. 7.1, reference X1 denotes the digitized form of the first signal of the first conductor L1 corresponding to the output signal of the first comparator 301 and X2 denotes the digitized form of the second signal of the second conductor L2, corresponding to the output signal of the second comparator 311. As indicated in FIG. 7.1 by prominent points in the signal diagram of the digitized first and second signal X1, X2, the second digitized signal X2 always has a falling flank when the first digitized signal X1 is high, due to the positive sign of the phase angle. This is determined by the logic processing device 48, stored, and then sent via the output A2 to the display 50, whereupon the left lamp 512 is lit.

FIG. 7.2 shows the case in which the second signal on the second conductor L2 leads the first signal on the first conductor L1.

As indicated in FIG. 7.2 by prominent points in the signal waveform of the digitized first and second signal X1, X2, the second digitized signal X2 does not have a falling flank when the first digitized signal X1 is high, due to the negative sign of the phase angle. This is determined by the logic processing device 48, stored, and sent via the output A2 to the display 50, whereupon the right lamp 502 is lit.

Even though the above first to third embodiments were discussed individually, they can, of course, be combined. Also, several sequential events, i.e., measurements, can be linked in sequential signal periods, e.g., averaged. This is important particularly in the case of signals having a high noise component.

What is claimed is:

1. Device for determining the sign of a phase angle of first and second, essentially identical, periodic electrical signals on corresponding first and second electrical conductors, particularly to determine the phase sequence in a three-phase power system comprising a common node to which said first and second electrical conductors are connected, said common node being at a potential;

a sensing device for sensing the first signal from the first conductor and the second signal from the second conductor, said sensing device having a sensing element that is comprised exclusively of resistive components;

a trigger device for receiving the sensed first signal and specifying a time reference point and/or a time reference window within the signal period of the first signal and outputting a correspondence trigger signal; and a determination device for receiving the trigger signal and the sensed second signal and determining the sign of the phase angle under consideration at least of the value of the second signal at the time reference point and/or the waveform of the second signal within the time reference window.

2. Device according to claim 1, characterized in that the trigger device is structured in such a manner that it specifies a predetermined zero crossing of the first signal as the time reference point.

3. Device according to claim 1, characterized in that the determining device is designed in such a manner that it determines the sign of the phase angle from the sign of the second signal at the time reference point.

4. Device according to claim 1, characterized in that the trigger device has a first comparator device to receive the first signal and to compare it with a predetermined reference potential and a differentiating device for taking the derivative of the output signal of the first comparator device, and the determination device has a second comparator device to receive the second signal and to compare it with the predetermined reference potential and a memory device to receive the output signal of the second comparator device and of the output signal from the differentiating device, wherein the memory device is designed in such a manner that for each output signal from the differentiating device with a predetermined sign, said memory device stores the sign of the output signal of the second comparator device.

5. Device according to claim 4, characterized in that the memory device has a flip-flop unit.

6. Device according to claim 1, characterized in that the trigger device is designed in such a manner that as a time reference window, it specifies a half signal period of the first signal following a predetermined zero crossing of the first signal.

7. Device according to claim 6, characterized in that the determination device is designed in such a manner that it determines the sign of the phase angle by determining whether the second signal has a predetermined zero crossing within the time reference window.

8. Device according to claim 7, characterized in that the trigger device has a first comparator device to receive the first signal and to compare it with a predetermined reference potential and a differentiating device to take the derivative of the output signal of the first comparator device and also a time-window generation device to receive the output signal of the differentiating device and to create a time window signal for each output signal of the differentiating device with a predetermined sign; and the determination device has a second comparator device to receive the second signal and to compare it with the predetermined reference potential and a memory device to receive the time window signal of the time window generating device and of the output signal of the second comparator device, wherein the memory device is designed in such a manner that it stores the arrival of the predetermined zero crossing of the second signal within the time reference window.

9. Device according to claim 8, characterized in that the memory device has a Schmitt-trigger device.

10. Device according to claim 1, characterized in that the trigger device is designed in such a manner that it specifies a predetermined half wave of the first signal as the time reference window.

11. Device according to claim 10, characterized in that the determination device is designed in such a manner that it digitizes and stores at least the second signal and determines the sign of the phase angle by determining whether the digitized second signal has a predefined flank within the time reference window.

12. Device according to claim 11, characterized in that the trigger device has a second comparator device to receive the second signal and to compare it with the predetermined reference potential and a logic processing device to receive the output signal of the first comparator device and of the second comparator device, in that the determination device has a second comparator device to receive the second signal and to compare it with the predetermined reference potential and a logic processing device to receive the output signal of the first comparator device and of the second comparator device, and in that the logic processing device is designed in such a manner that it determines the sign of the phase angle by determining whether the second signal has a predetermined flank when the output signal of the first comparator device takes on a predefined state.

13. Device according claim 1, characterized by a display device, connected to the determination device to display the determined sign of the phase angle.

14. Device according to claim 1, characterized in that the common node can be connected to ground.

15. Device according to claim 14, characterized in that a galvanic connection device is provided to connect the common node to ground.

16. Device according to claim 14, characterized in that a resistive connecting device running via a shock-proof electrode and the human body is used for connecting to the common node.

17. Device according to claim 14, characterized in that a capacitive connecting device running via the human body is provided for connection of the common node to ground.

18. Method for determining the sign of a phase angle of a first and second, essentially identical, periodic electrical signals on corresponding first and second electrical conductors, in particular determining the phase sequence in a three-phase power system, with the steps:

sensing the first signal from the first conductor and the second signal from the second conductor with only resistive components;

specifying a time reference point and/or a time reference window within the signal period of the first signal; and determining the sign of the phase angle under consideration at least of the value of the second signal at the time reference point and/or the waveform of the second signal within the time reference window.

* * * * *